United States Patent [19]

Seiwa et al.

[11] Patent Number: 4,868,837
[45] Date of Patent: Sep. 19, 1989

[54] SEMICONDUCTOR LASER

[75] Inventors: Yoshito Seiwa, Itami; Toshitaka Aoyagi, Amagasaki, both of Japan

[73] Assignee: Mitsubishi Denki Kabushiki Kaisha, Japan

[21] Appl. No.: 235,294

[22] Filed: Aug. 23, 1988

[30] Foreign Application Priority Data

Jan. 14, 1988 [JP] Japan .................................. 63-7314

[51] Int. Cl.[4] ............................................... H01S 3/19
[52] U.S. Cl. ........................................ 372/46; 372/45; 372/48
[58] Field of Search ........................ 372/43, 45, 46, 48

[56] References Cited

U.S. PATENT DOCUMENTS 4,674,094  6/1987  Murakami ............................. 372/45
4,768,200  8/1988  Isshiki .................................... 372/46

OTHER PUBLICATIONS

"Transverse Mode Stabilized $Al_xGa_{1-x}As$ Injection Lasers with Channeled-Substrate-Planar Structure", Aiki et al, IEEE Journal of Quantum Electronics, vol. QE-14, No. 2, Feb. 1978, pp. 89-94.

"Visible GaAlAs V-Channeled Substrate Inner Stripe Laser with Stabilized Mode Using p-GaAs Substrate", Yamamoto et al, Applied Physics, Letters 40(5), Mar. 1982, pp. 372-374.

Primary Examiner—William L. Sikes
Assistant Examiner—Georgia Y. Epps
Attorney, Agent, or Firm—Leydig, Voit & Mayer

[57] ABSTRACT

A semiconductor laser includes an active region which includes a portion having a refractive index distribution with a relatively samll refractive index difference which allows only the fundamental mode of the transverse modes in the neighborhood of the light output facet. The other region of the active region has a refractive index distribution with a large refractive index difference which allows the fundamental mode as well as higher order modes.

7 Claims, 2 Drawing Sheets

SEMICONDUCTOR LASER

FIELD OF THE INVENTION

The present invention relates to a semiconductor laser, and more particularly, to a laser capable of high power output operation at the fundamental mode.

BACKGROUND OF THE INVENTION

FIG. 4 shows a conceptual view of a light waveguide according to a prior art semiconductor laser. In FIG. 4, reference numeral 1 designates an active region. Reference numerals 2 and 2a designate p and n type cladding layers, respectively, between which the active region 1 is sandwiched. Reference numerals 3 designate low refractive index regions which are disposed between cladding layers 2 and 2a on the left and right sides of the active region 1. A pair of resonator facets 4 and 4a are provided at the both end surfaces of the laser resonator. P side and n side electrodes 5 and 5a are disposed on the p type and the n type cladding layers 2 and 2a, respectively. Reference character W represents width of the active region 1.

FIG. 5 shows a refractive index distribution in the direction across the face of the active region 1, that is, in the transverse direction. Reference character $\overline{N}$ represents the refractive index of the active region 1 and reference character $\Delta\overline{N}$ represents the refractive index difference between the refractive indices of the active region 1 and the low refractive index region 3. This refractive index distribution is the same throughout the resonator length.

The device operates as follows.

When a voltage is applied between the p side electrode 5 and the n side electrode 5a, electrons and holes injected therefrom recombine the active region 1, thereby generating light having a wavelength corresponding to the energy band gap of the active region 1.

This light is confined in the active region 1 because the refractive index $\overline{N}$ of the active region 1 is higher than that at the periphery as shown in FIG. 5. Accordingly, when the injected current reaches a predetermined value, laser oscillation occurs.

The maximum light output of the semiconductor laser is restricted by the energy density of the laser light at the resonator facets 4 and 4a. In order to obtain a high power output, the width W of the active region 1 is made larger to reduce the energy density.

In the prior art semiconductor laser of such a construction, it is possible to increase the light output by increasing the width W of the active region 1 without changing the refractive index difference $\Delta\overline{N}$ because the refractive index distribution throughout the resonator direction is uniform. When W is increased, however, higher order transverse modes are excited and light including those modes is emitted. Furthermore, if the refractive index difference $\Delta\overline{N}$ is reduced in order to stabilize the mode, the light confinement is weakened and the threshold current is increased.

SUMMARY OF THE INVENTION

An object of the present invention is to provide a semiconductor laser capable of emitting a high power fundamental mode light output and having a low threshold current.

Other objects and advantages of the present invention will become apparent from the detailed description given hereinafter, it should be understood, however, that the detailed description and specific embodiment are given by way of illustration only, since various changes and modifications within the spirit and scope of the invention will become apparent to those skilled in the art from this detailed description.

According to the present invention, an active region has a portion having a refractive index distribution with a relatively small refractive index difference which allows only the fundamental mode of the transverse modes at the neighbourhood of the light output side facet and a portion having a refractive index distribution with a relatively large refractive index difference which allows the fundamental mode as well as higher order modes at the central portion of the resonator. Accordingly, confinement of light in an active region is improved except for the neighbourhood of the light output facet. The laser light including higher order modes excited in the active except for the neighbourhood of the facet, having a large refractive index difference is converted into the fundamental mode in the neighbourhood of the light output facet and this fundamental mode light is emitted.

DETAILED DESCRIPTION OF THE PREFERRED EMBODIMENTS

An embodiment of the present invention will be described in detail with reference to the drawings.

Figure 1:
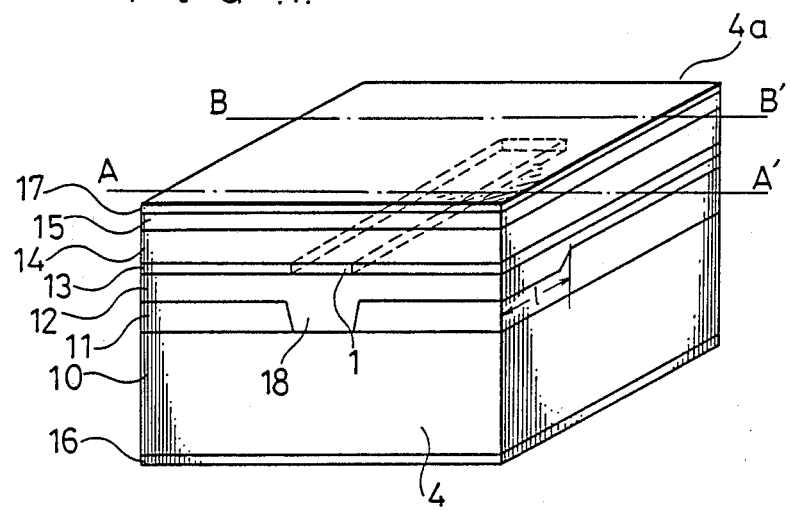
FIG. 1 is a perspective view showing a structure of a semiconductor laser according to the present invention.
Figure 2:
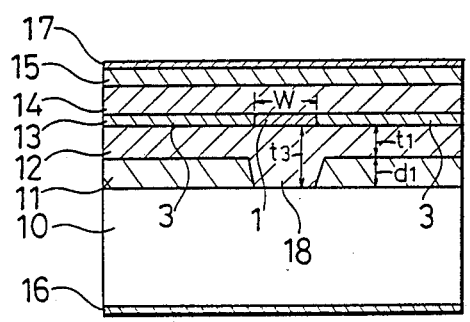
FIGS. 2(a) and (b) are cross-sectional views at the neighbourhood of the light output facet and at the central portion of the resonator of the semiconductor laser shown in FIG. 1, respectively.
Figure 2:
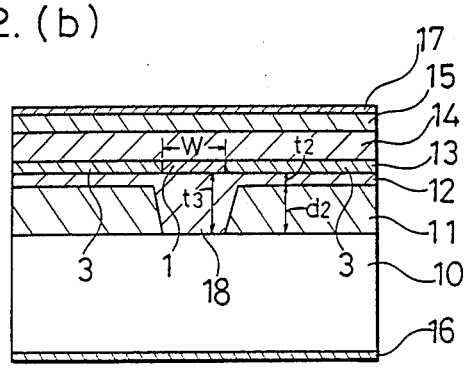
Figure 3:
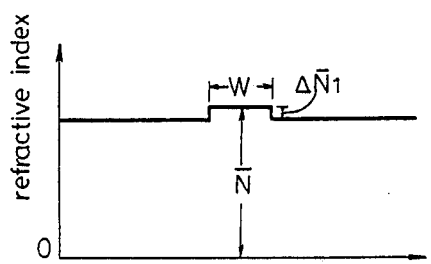
FIGS. 3(a) and (b) are diagrams showing equivalent refractive index differences in the neighbourhood of light output facet and in the central portion of the resonator of the semiconductor laser shown in FIG. 1, respectively.
Figure 3:
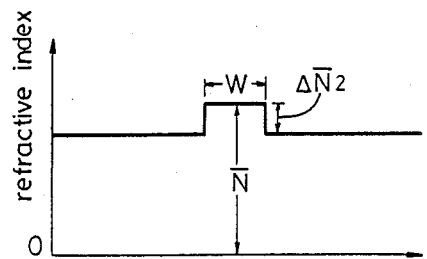
Figure 4:
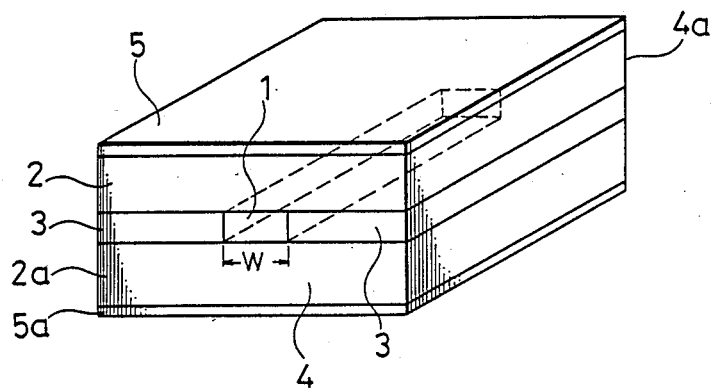
FIG. 4 is a conceptional view of a light waveguide according to a prior art semiconductor laser.
Figure 5:
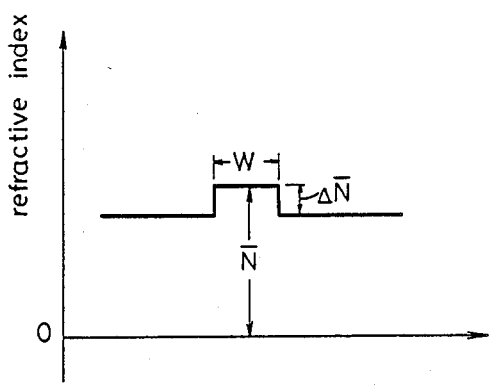
FIG. 5 is a diagram showing a refractive index distribution according to a prior art semiconductor laser.

FIG. 1 shows a structure of an internal stripe type semiconductor laser. FIGS. 2(a) and (b) show cross-sectional views taken along lines A to A' and B to B' of the laser of FIG. 1, respectively. FIGS. 3(a) and (b) show equivalent refractive index distributions corresponding to FIGS. 2(a) and (b), respectively.

Reference numerals 4 and 4a designate a pair of resonator facets. Reference numeral 10 designates a p type GaAs substrate. A current blocking layer 11 comprising n type GaAs is provided on the p type GaAs substrate 10, and this current blocking layer 11 has a thickness of $d_1 = 0.6$ μm in the neighbourhood of the light output facet 4 and a thickness of $d_2 = 1.1$ μm at the central portion of the resonator. The length l of reduced thickness in the neighbourhood of the light output facet 4 is 10 to 20 μm compared to the resonator length 300 μm. A cladding layer 12 comprising p type $Al_{0.4}Ga_{0.6}As$ on the p type GaAs substrate 10 and the current blocking layer 11 has a thickness of $t_1 = 0.7$ μm on the current blocking layer 11 in the neighbourhood of the light output resonator facet 4, a thickness of $t_2 = 0.2$ μm on the current blocking layer 11 at the central portion of the resonator, and a thickness of $t_3 = 1.3$ μm on the substrate 10. This cladding layer 12 is grown so as not to include the step in current blocking layer 11 produced by the different thickness or produced by the channel region. An active layer 13 comprising p type $Al_{0.1}Ga_{0.9}As$ having a thickness of 0.08 μm is provided on the cladding layer 12. Reference numeral 1 designates an active region. Reference numerals 3 designate low refractive index regions on both sides of the active region 1 and between cladding layer 14 and cladding layer 12. An n type cladding layer 14 comprising n type $Al_{0.4}Ga_{0.6}As$ having a thickness of 1.5 μm is provided on the active layer 13. An n type contact layer 15 comprising n type GaAs is provided on the n type cladding layer 14. A p side electrode 16 is provided on the p type GaAs substrate 4 and an n side electrode 17 is provided on the n type cladding layer 14, respectively. Reference numeral 18 designates a channel region having an aperture width of 6 μm which is approximately the same as the width W of the active region 1. $\Delta\overline{N}_1$ and $\Delta\overline{N}_2$ represent equivalent refractive index differences between the active region 1 and the low refractive index region 3 at the neighbourhood of the light output resonator facet 4 and at the central portion of the resonator, respectively. The equivalent refractive index difference $\Delta\overline{N}_1$ is less than the equivalent refractive index difference $\Delta\overline{N}_2$, and has a value which only allows light propagation in the fundamental mode. That is, if W=6 μm, $\Delta\overline{N}_1/\overline{N}$ is below 0.02%.

Herein, as a matter of course, the energy band gaps of the cladding layers 12 and 14 are wider than that of the active layer 13.

The operation of the semiconductor laser of the present invention will be described.

When a voltage is applied between the p side electrode 16 and n side electrode 17, holes and electrons which are injected from the p side electrode 16 and the n side electrode 17 are concentrated efficiently on the active region 1 on the channel region 18 by the functioning of the current blocking layer 11. The charge carries combine, thereby generating light having a wavelength corresponding to the energy band gap of the active region 1. When the injected current reaches a predetermined current, laser oscillation occurs.

Because this laser light is absorbed by the current blocking layer 11, the equivalent refractive index of the low refractive index region 3 on the current blocking layer 11 becomes less than the equivalent refractive index of the active region 1 above the channel region 18, and the laser light is confined in the active layer 13. The thinner the cladding layer 12 on the current blocking layer 11 is, that is, the shorter the distance between the active region 1 and the current blocking layer 11 is, the higher the refractive index difference is.

In the present invention, the thickness $t_2$ is made small except for the neighbourhood of the resonator facet 4 as shown in FIG. 2(b), thereby increasing the equivalent refractive index difference $\Delta\overline{N}_2$ as shown in FIG. 3(b), allowing higher order oscillation modes. However, the confinement of light in the active region 1 is improved and the operationing current is lowered.

On the other hand, at the neighbourhood of the resonator facet 4, the thickness $t_1$ is increased as shown in FIG. 2(a) and thus the equivalent refractive index difference $\Delta\overline{N}_1$ is made less as shown in FIG. 3(a). Accordingly, a waveguide which allows only the fundamental oscillation mode is constituted and the laser light emission is restricted to the fundamental mode. Furthermore, exudation of laser light into the low refractive index region 3 is increased and the light density is lowered, thereby enabling high power output.

In the semiconductor laser of this embodiment, the thickness $t_2$ of the cladding layer 12 on the current blocking layer 11 is made small except for the neighbourhood of the resonator facet 4. Thus, the leakage current is reduced and the operating current is lowered. The length l of the low refractive index difference region is set to 10 to 20 μm for a resonator length 300 μm as described above so as to secure safe cleavages of semiconductor wafer into chips. While in the above-illustrated embodiment a region having a low refractive index difference between the active region 1 and the low refractive index region 3 is provided only in the neighbourhood of the light output resonator facet 4, this difference may also be provided in the neighbourhood of the resonator facet 4a which opposes the resonator facet 4. When a low refractive index distribution region is also provided at the side of the resonator facet 4a, it is effective to prevent COD (Catastrophic Optical Damage) which may arise in the neighbourhood of the resonator facet due to heat generated by light. In the case where a low refractive index distribution region is provided only at the side of the resonator facet 4 as in the above illustrated embodiment, an asynchronous, low reflectance film coating is disposed on the surface of the resonator facet 4 and a high reflectance film preferably is disposed the surface of the resonator facet 4a to prevent COD. Herein, in view of obtaining a low threshold current, the total length of the low refractive index distribution region(s) is preferred to be short.

While in the above-illustrated embodiment an internal stripe type laser in which the refractive index distribution constituting an equivalent refractive index difference is described, a buried type laser in which an embedded region is produced such that the refractive index difference within the active region is small in the neighbourhood of the resonator facet and is large at the central portion of the resonator may also be achieved.

While in the above-illustrated embodiment the lower and upper cladding layers 12 and 14 comprise $Al_{0.4}Ga_{0.6}Al$ and the active layer 13 comprises $Al_{0.1}Ga_{0.9}As$, the lower and upper cladding layers 12 and 14 may comprise $Al_xGa_{1-x}As$ and the active layer 13 may comprise $Al_yGa_{1-y}As$ where $0 \leq y < 0.2$ and $y + 0.25 < x \leq 1$.

As is evident from the foregoing description, according to the present invention, an active region has a portion having a refractive index distribution with a small refractive index difference which allows only the fundamental mode of the transverse modes in the neighbourhood of the light output facet, and having a portion having a refractive index distribution with a large refractive index difference which allows the fundamental mode as well as higher order modes at the central portion of the resonator. Accordingly, a semiconductor laser achieving a high power output operation at a low operating current and emitting laser light of fundamental transverse mode is obtained.

What is claimed is:

1. A semiconductor laser comprising:
   a first electrode;
   a first conductivity type semiconductor substrate disposed on said first electrode;
   a discontinuous second conductivity type current blocking layer disposed on said first conductivity type semiconductor substrate including first and second portions having an aperture extending therebetween and through said current blocking layer to said substrate;

a first conductivity type first cladding layer disposed on said semiconductor substrate in said aperture and on said second conductivity type current blocking layer;

an active layer disposed on said first conductivity type first cladding layer comprising an active region having a width and a first refractive index and first and second regions, said active region being disposed between said first and second regions of said active layer and opposite said aperture;

a second conductivity type second cladding layer disposed on said active layer;

a second conductivity type contact layer disposed on said second cladding layer;

a second electrode disposed on said contact layer; and opposed, spaced apart first and second facets for reflecting and transmitting light generated in said laser, said first and second facets being disposed generally transverse to said current blocking, active, and first and second cladding layers, wherein said aperture extends from said first facet to said second facet and said current blocking layer is relatively thin adjacent said first facet and relatively thick elsewhere, said first cladding layer is relatively thick adjacent said first facet and relatively thin elsewhere, the sum of the thicknesses of said current blocking layer and said first cladding layer being relatively constant between said first and second facets.

2. A semiconductor laser as defined in claim 1 wherein said first conductivity type semiconductor substrate comprises p type GaAs, said second conductivity type current blocking layer comprises n type GaAs, said first cladding layer comprises p type $Al_xGa_{1-x}As$, said active layer comprises p type $Al_yGa_{1-y}As$, said second cladding layer comprises n type $Al_xGa_{1-x}As$, wherein $0 \leq y < 0.2$, $y + 0.25 < x \leq 1$, and said second conductivity type contact layer comprises n type GaAs.

3. The laser of claim 1 wherein said current blocking layer is relatively thin adjacent said second facet and relatively thick elsewhere except adjacent said first facet and said first cladding layer is relatively thick adjacent said second facet and relatively thin elsewhere except adjacent said first facet.

4. The laser of claim 1 wherein said aperture has a width between said first and second portions of said current blocking layer approximately the same as the width of said active region.

5. The laser of claim 1 wherein said current blocking layer is relatively thin adjacent said first facet in the direction of said second facet for about 3 to about 7 percent of the separation between said first and second facets.

6. The laser of claim 1 wherein said first and second cladding layers have energy band gaps that are larger than the energy band gap of said active layer.

7. The laser of claim 1 wherein a relatively low reflectance coating is disposed on said first facet and a relatively high reflectance coating is disposed on said second facet.

* * * * *